(12) United States Patent
Akamatsu

(10) Patent No.: US 7,737,510 B2
(45) Date of Patent: Jun. 15, 2010

(54) SEMICONDUCTOR DEVICE AND METHOD FOR FABRICATING THE SAME

(75) Inventor: Susumu Akamatsu, Osaka (JP)

(73) Assignee: Panasonic Corporation, Osaka (JP)

( * ) Notice: Subject to any disclaimer, the term of this patent is extended or adjusted under 35 U.S.C. 154(b) by 177 days.

(21) Appl. No.: 11/545,427

(22) Filed: Oct. 11, 2006

(65) Prior Publication Data
US 2007/0096184 A1    May 3, 2007

(30) Foreign Application Priority Data
Oct. 27, 2005 (JP) ............... 2005-313178

(51) Int. Cl.
H01L 29/76 (2006.01)
(52) U.S. Cl. .................. 257/408; 257/369
(58) Field of Classification Search .......... 257/408, 257/369, 900, 903
See application file for complete search history.

(56) References Cited

U.S. PATENT DOCUMENTS

| | | | | |
|---|---|---|---|---|
| 3,999,166 A * | 12/1976 | Goser et al. | ............. | 365/156 |
| 4,356,623 A * | 11/1982 | Hunter | ............. | 438/305 |
| 4,878,100 A * | 10/1989 | McDavid | ............. | 257/408 |
| 5,323,053 A * | 6/1994 | Luryi et al. | ............. | 257/485 |
| 5,789,787 A * | 8/1998 | Kadosh et al. | ............. | 257/369 |
| 5,846,857 A | 12/1998 | Ju | | |
| 6,492,665 B1 | 12/2002 | Akamatsu et al. | | |
| 7,279,746 B2 * | 10/2007 | Doris et al. | ............. | 257/338 |
| 7,321,155 B2 * | 1/2008 | Ko et al. | ............. | 257/408 |
| 7,326,622 B2 * | 2/2008 | Liu et al. | ............. | 438/301 |
| 2004/0262784 A1 | 12/2004 | Doris et al. | | |

FOREIGN PATENT DOCUMENTS

| | | |
|---|---|---|
| JP | 10-242293 | 9/1998 |
| JP | 2001-516154 | 9/2001 |

OTHER PUBLICATIONS

S. Ito et al., "Mechanical Stress Effect of Etch-Stop Nitride and Its Impact on Deep Submicron Transistor Design" IEDM 2000, p. 247.
H.S. Yang, et al., "Dual Stress Liner for High Performance Sub-45NM Gate Length SOI CMOS Manufacturing" IEDM 2004, p. 1075.
Chinese Office Action, with English translation, issued in Chinese Patent Application No. 200610142449.7, mailed May 8, 2009.

* cited by examiner

*Primary Examiner*—Mark Prenty
(74) *Attorney, Agent, or Firm*—McDermott Will & Emery LLP

(57) ABSTRACT

A gate insulating film and a gate electrode are formed on an active region of a semiconductor substrate. A sidewall forming an L shape in cross section is formed on the sides of the gate electrode. Source/drain regions are formed in regions of the semiconductor substrate located outside an area covering the gate electrode and the sidewall. A stress-applying stress liner film is formed to cover the gate electrode and the sidewall.

47 Claims, 12 Drawing Sheets

US 7,737,510 B2

SEMICONDUCTOR DEVICE AND METHOD FOR FABRICATING THE SAME

BACKGROUND OF THE INVENTION (1) Field of the Invention

The present invention relates to semiconductor devices and methods for fabricating the same, and more particularly relates to MIS transistors and methods for forming the same.

(2) Description of Related Art

In recent years, with an increase in the degree of integration, functionality and speed of semiconductor integrated circuit devices, there have been demands for miniaturization in the size of transistors and increase in the driving force thereof. Meanwhile, there have been demands for low-power-consumption semiconductor permitting a reduction in energy consumption and long-time use of mobile equipment. It has become impossible to enhance the driving force of transistors only by reducing the gate length of the transistors. In a case where a gate insulating film of a transistor is reduced in thickness to enhance the driving force thereof, this increases the gate leakage current. To cope with this, a technique has been suggested in which a stress-applying film is formed to allow application of stress to the channel of a transistor, resulting in the enhanced driving force of the transistor.

FIGS. 14A through 14D are cross-sectional views illustrating process steps in a known fabrication method for a semiconductor device (see, for example; S. Ito et al., IEDM 2000, page 247). In the known fabrication method for a semiconductor device, first, in the process step illustrated in FIG. 14A, an isolation region 202 is formed in the upper portion of a semiconductor substrate 201, and then a gate insulating film 203 is formed on an active region of the semiconductor substrate 201. Thereafter, a gate electrode 204 is formed on the gate insulating film 203, and source/drain (SD) extension diffusion regions 205 are formed in the upper portion of the semiconductor substrate 201 using the gate electrode 204 as a mask. Thereafter, a silicon oxide film 206a and a silicon nitride film 207a are formed to cover the semiconductor substrate 201 and the gate electrode 204.

Next, in the process step illustrated in FIG. 14B, the silicon oxide film 206a and the silicon nitride film 207a are subjected to anisotropic etching, thereby forming sidewalls 206 and 207 on both sides of the gate electrode 204. Thereafter, source/drain regions 208 are formed by implanting ions from above the gate electrode 204 and the sidewalls 206 and 207 into the semiconductor substrate 201.

Next, in the process step illustrated in FIG. 14C, a tensile SiN film 209 is deposited on the entire substrate area.

Subsequently, in the process step illustrated in FIG. 14D, an interlayer dielectric 210 is deposited and planarized. Thereafter, contact holes 211 are formed in the interlayer dielectric 210 by lithography and then filled with tungsten, thereby forming contacts 212.

However, in the known semiconductor device, stress caused by the tensile SiN film 209 has insufficiently traveled to channel regions of the semiconductor device, and as a result the driving force of the semiconductor device has not been sufficiently enhanced.

SUMMARY OF THE INVENTION

In order to solve the above-mentioned problem, it is an object of the present invention to provide a high-driving-force semiconductor device and a fabrication method for the same by taking a measure for allowing stress caused by a stress-applying film to sufficiently travel to channel regions of the semiconductor device.

A semiconductor device having a MIS transistor according to an aspect of the present invention includes: a first gate insulating film formed on a semiconductor substrate; a first gate electrode formed on the first gate insulating film; a first sidewall covering the sides of the first gate electrode and the top surface of part of the semiconductor substrate and made of an insulating film forming an L shape in cross section; first source/drain regions formed in regions of the semiconductor substrate located outside an area covering the first gate electrode and the first sidewall; and a stress-applying insulating film covering the first gate electrode and the first sidewalls.

In the semiconductor according to the aspect of the present invention, the stress-applying insulating film is formed to cover the first sidewalls. Therefore, a stress caused by the stress-applying insulating film is more likely to travel to the channel of the MIS transistor than in the known art in which a stress-applying insulating film is formed to cover sidewalls covering first sidewalls forming an L shape in cross section. This can enhance the driving force of the MIS transistor. The semiconductor device according to the aspect of the present invention is formed in the following manner: Sidewalls are formed to cover the first sidewalls; ions are implanted into the semiconductor substrate using the first sidewalls and the sidewalls as masks, thereby forming source/drain regions; and then the sidewalls are removed.

In the semiconductor device of the aspect of the present invention, the semiconductor substrate may be made of silicon, and a gate length direction of the first gate electrode may be along a <100> orientation of the silicon. In this case, when the MIS transistor is an N-channel transistor and the stress-applying film has a tensile stress, the driving force of the MIS transistor can be further enhanced. On the other hand, when the MIS transistor is a P-channel transistor and the stress-applying film has a compressive stress, the driving force of the MIS transistor can be restrained from decreasing.

In the semiconductor device of the aspect of the present invention, silicide layers may be formed in an upper portion of the first gate electrode and respective upper portions of the first source/drain regions.

In the semiconductor device of the aspect of the present invention, a second sidewall forming a plate-like shape in cross section may be formed between the first gate electrode and the first sidewall.

In the semiconductor device of the aspect of the present invention, SD extension diffusion regions may be formed in regions of the semiconductor substrate located under the first sidewall.

In the semiconductor device of the aspect of the present invention, the MIS transistor may be an N-type MIS transistor, and the stress-applying insulating film may have a tensile stress.

In a case where the MIS transistor is an N-type MIS transistor, the semiconductor device may further include a P-type MIS transistor. The P-type MIS transistor may include: a second gate insulating film formed on the semiconductor substrate; a second gate electrode formed on the second gate insulating film; a third sidewall formed on the sides of the second gate electrode and forming an L shape in cross section; a four sidewall formed on the third sidewall; and second source/drain regions formed in regions of the semiconductor substrate located outside an area covering the second gate electrode and the third sidewall.

The semiconductor device of the aspect of the present invention may further include: an interlayer dielectric covering the N-type MIS transistor and the P-type MIS transistor; and a contact passing through the interlayer dielectric and reaching the second source/drain regions of the P-type MIS transistor. The contact may come into contact with the fourth sidewall.

In the semiconductor device of the aspect of the present invention, the N-type MIS transistor and the P-type MIS transistor may form an SRAM.

In the semiconductor device of the aspect of the present invention, the MIS transistor may be a P-type MIS transistor, and the stress-applying insulating film may have a compressive stress. In this case, the stress becomes more likely to travel to the channel of the P-type MIS transistor. This can further enhance the driving force of the P-type MIS transistor.

A method for fabricating a semiconductor device according to another aspect of the present invention includes a MIS transistor having a first gate insulating film and a first gate electrode. The method includes the steps of: (a) forming a first insulating film covering the top surface of the first gate electrode and the top surface of a semiconductor substrate and a second insulating film covering the first insulating film; (b) subjecting the first and second insulating films to anisotropic etching, thereby forming, on the sides of the first gate electrode, a first sidewall formed of part of the first insulating film and a second sidewall formed of part of the second insulating film; (c) implanting ions into the semiconductor substrate using the first gate electrode, the first sidewalls and the second sidewalls as masks, thereby forming first source/drain regions in the semiconductor substrate; (d) after the step (c), selectively removing the second sidewall; and (e) after the step (d), forming a stress-applying insulating film to cover the first sidewall.

In the method according to said another aspect of the present invention, the second sidewalls are removed in the step (d). Therefore, the stress-applying insulating film can be located closer to the channel of the MIS transistor than that in the known art in which sidewalls corresponding to the second sidewalls are not removed. Hence, a stress caused by the stress-applying insulating film becomes more likely to travel to the MIS transistor than that in the known art. This permits formation of a higher-driving-force MIS transistor than in the known art.

In the method of said another aspect of the present invention, the semiconductor substrate may be made of silicon, and a gate length direction of the first gate electrode may be along a <100> orientation of the silicon. In this case, when the MIS transistor is an N-channel transistor and the stress-applying film has a tensile stress, the driving force of the MIS transistor can be further enhanced. On the other hand, when the MIS transistor is a P-channel transistor and the stress-applying film has a compressive stress, the driving force of the MIS transistor can be restrained from decreasing.

In the method of said another aspect of the present invention, in the step (d), the second sidewall may be removed by being etched on conditions that the second sidewall is given a higher etching selectivity than the first sidewall.

In the method of said another aspect of the present invention, in the step (b), the first sidewall may form an L shape in cross section.

The method of said another aspect of the present invention may further include the step of, after the step (c), forming silicide layers in an upper portion of the first gate electrode and respective upper portions of the first source/drain regions.

The method of said another aspect of the present invention may further include the step of, before the step (a), forming a third sidewall forming a plate-like shape in cross section on the sides of the first gate electrode. In the step (a), the first insulating film may be formed to cover the first gate electrode and the third sidewall.

The method of said another aspect of the present invention may further include the step of implanting ions into the semiconductor substrate using the first gate electrode as a mask, thereby forming SD extension diffusion regions in the semiconductor substrate.

The method of said another aspect of the present invention, the MIS transistor may be an N-type MIS transistor, and a film having a tensile stress may be formed as the stress-applying insulating film.

In the method of said another aspect of the present invention, the semiconductor device may further include a P-type MIS transistor having a second gate insulating film and a second gate insulating film. In the step (a), the first insulating film and the second insulating film may be formed to cover also the second gate electrode. In the step (b), the first and second insulating films may be subjected to anisotropic etching, thereby further forming, on the sides of the second gate electrode, a fourth sidewall formed of part of the first insulating film and a fifth sidewall formed of part of the second insulating film. The method may further include the step of implanting ions into the semiconductor substrate using the second gate electrode and the fourth and fifth sidewalls as masks, thereby forming second source/drain regions in the semiconductor substrate. In the step (d), the fifth sidewall may be left without being removed. In the step (e), the stress-applying insulating film may be formed to cover the fifth sidewall.

The method of said another aspect of the present invention may further include the steps of: (f) after the step (e), forming an interlayer dielectric to cover the stress-applying insulating film; (g) forming contact holes to pass through the interlayer dielectric and reach the second source/drain regions; and (h) filling the contact holes with a conductor. In the step (g), part of the stress-applying insulating film covering the fifth sidewall may be removed, thereby forming the contact holes.

In the method of said another aspect, the N-type MIS transistor and the P-type MIS transistor may form an SRAM.

In the method of said another aspect of the present invention, the MIS transistor may be an N-type MIS transistor, and a film having a compressive stress may be formed as the stress-applying insulating film.

DETAILED DESCRIPTION OF THE INVENTION

Embodiment 1

A semiconductor device according to a first embodiment of the present invention will be described hereinafter with reference to the drawings.

Figure 1:
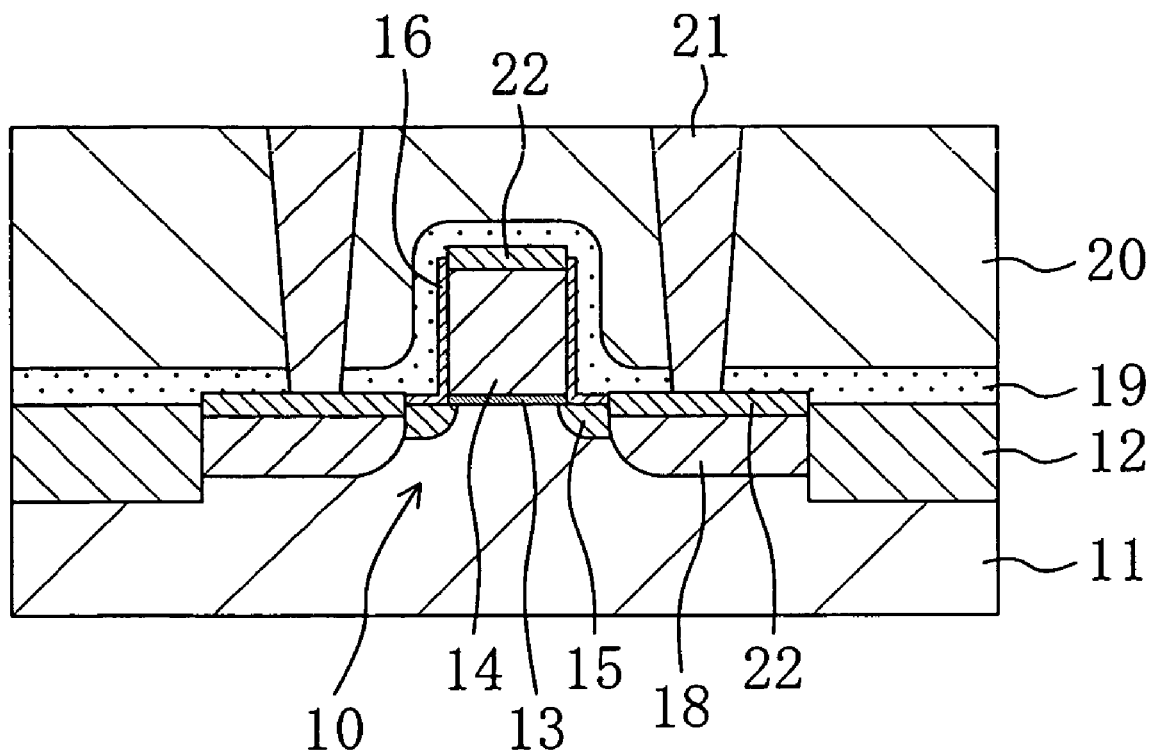
FIG. 1 is a cross-sectional view illustrating the structure of a semiconductor device according to a first embodiment of the present invention.

FIG. 1 is a cross-sectional view illustrating the structure of a semiconductor device according to the first embodiment of the present invention. As illustrated in FIG. 1, in the semiconductor device of this embodiment, an isolation region 12 is formed in the upper portion of a semiconductor substrate 11 to surround an active region 10 of the semiconductor substrate 11. A gate insulating film 13 of silicon oxide is formed on the active region 10 of the semiconductor substrate 11, and a gate electrode 14 of polysilicon is formed on the gate insulating film 13.

SD extension diffusion regions 15 containing an N-type impurity at a concentration of $1\times10^{19}$ through $1\times10^{20}/cm^3$ are formed in regions of the active region 10 of the semiconductor substrate 11 extending from immediately below both lateral end parts of the gate electrode 14 and beyond both sides thereof.

Approximately 10-nm-thick sidewalls of silicon oxide forming an L shape in cross section are formed to cover both sides of the gate electrode 14 and parts of the semiconductor substrate 11 located to both lateral end parts of the gate electrode 14. Source/drain regions 18 containing an N-type impurity at a concentration of $1\times10^{20}/cm^3$ or more are formed in regions of the semiconductor substrate 11 located further from the gate electrode 14 than the SD extension diffusion regions 15, i.e., regions of the semiconductor substrate 11 located outside an area covering the gate electrode 14 and the L-shaped sidewalls 16.

Silicide layers 22 are formed in the upper portions of the source/drain regions 18 of the semiconductor substrate 11 and in the upper portion of the gate electrode 14. A stress liner film 19 of silicon nitride is formed to cover the top surface of one of the silicide layers 22 located in the upper portion the gate electrode 14, the entire surfaces of the L-shaped sidewalls 16 and the top surfaces of the other ones of the silicide layers 22 located in the upper portions of the source/drain regions 18 of the semiconductor substrate 11.

The entire surface of the stress liner film 19 is covered with an interlayer dielectric 20 of silicon oxide. Contacts 21 are formed to pass through the interlayer dielectric 20 and reach the top surfaces of the ones of the silicide layers 22 located in the upper portions of the source/drain regions 18.

In the semiconductor device of this embodiment, the gate electrode 14 and the source/drain regions 18 are arranged so that the surface orientation of the semiconductor substrate 11 along the channel direction (the direction along which current flows from the source region to the drain region) becomes <100> surface.

FIGS. 2A through 3C are cross-sectional views illustrating process steps in a fabrication method for a semiconductor device according to the first embodiment of the present invention. In the semiconductor device fabrication method of this embodiment, first, in the process step illustrated in FIG. 2A, a gate insulating film 13 is formed on a semiconductor substrate 11 of silicon, and a gate electrode 14 is formed on the gate insulating film 13. The gate electrode 14 is arranged so that its gate length direction is along the <100> orientation of silicon forming the semiconductor substrate 11. In this case, after a wafer is turned 45 degrees from its known orientation that allows the gate length direction to be along the <110> orientation of silicon, the gate electrode 14 may be patterned. Thereafter, an N-type impurity is implanted into the semiconductor substrate 11 at a dose of $1\times10^{15}$ through $3\times10^{15}/cm^2$ using the gate electrode 14 as a mask. In this way, SD extension diffusion regions 15 are formed in regions of the semiconductor substrate 11 extending from immediately below both lateral end parts of the gate electrode 14 and beyond both sides thereof to have a depth of 100 nm or less. Thereafter, a 10-nm-thick insulating film 16a is formed to cover the entire surface of the gate electrode 14 and the top surface of the semiconductor substrate 11. The SD extension diffusion regions 15 may be formed by implanting ions into the semiconductor substrate 11 after the formation of the insulating film 16a.

Figure 2A:
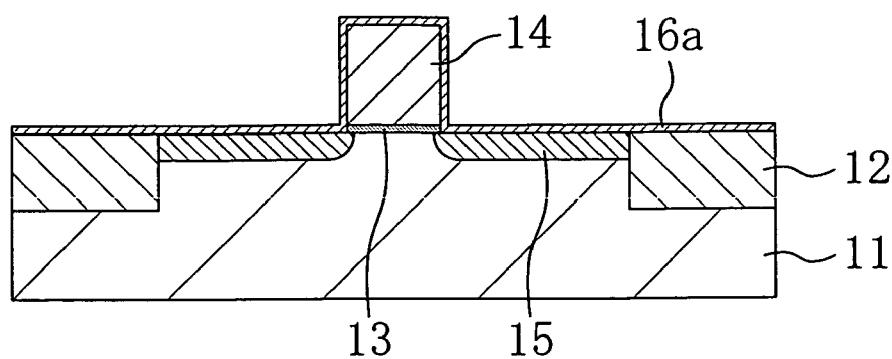
FIGS. 2A through 2C are cross-sectional views illustrating some of process steps in a fabrication method for a semiconductor device according to the first embodiment of the present invention.
Figure 2B:
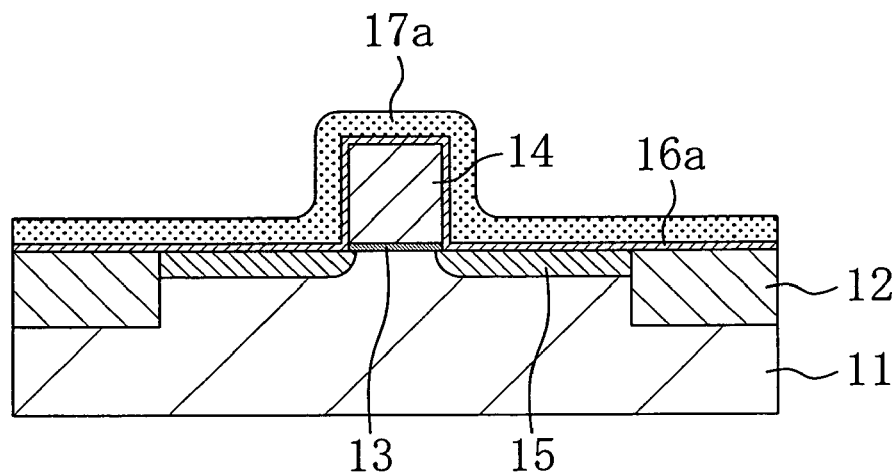

Next, in the process step illustrated in FIG. 2B, 30- through 50-nm-thick insulating film 17a of silicon nitride is formed on the insulating film 16a.

Figure 2C:
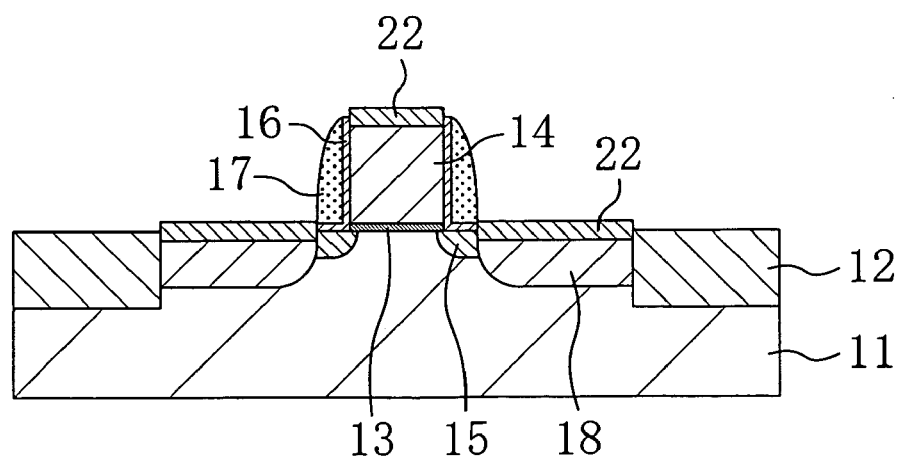

Next, in the process step illustrated in FIG. 2C, the insulating films 16a and 17a are subjected to anisotropic etching. In this way, L-shaped sidewalls 16 are formed to cover the lateral side surfaces of the gate electrode 14 and regions of the semiconductor substrate 11 located to both sides of the gate electrode 14, and sidewalls 17 are formed to cover both sides of the gate electrode 14 with the L-shaped sidewalls 16 interposed between the sidewalls 17 and the associated sides of the gate electrode 14. Thereafter, an N-type impurity is implanted into the semiconductor substrate 11 at a dose of $4\times10^{15}$ through $5\times10^{15}/cm^2$ using the gate electrode 14, the L-shaped sidewalls 16 and the sidewalls 17 as masks. In this way, source/drain regions 18 are formed in the semiconductor substrate 11. Thereafter, the impurity is activated by subjecting the substrate area to heat treatment at a temperature of 1000 through 1100° C. Subsequently, the top surface of the gate electrode 14 and the top surfaces of the source/drain regions 18 are silicided, thereby forming silicide layers 22 made of a reaction product of a refractory metal and silicon.

Figure 3A:
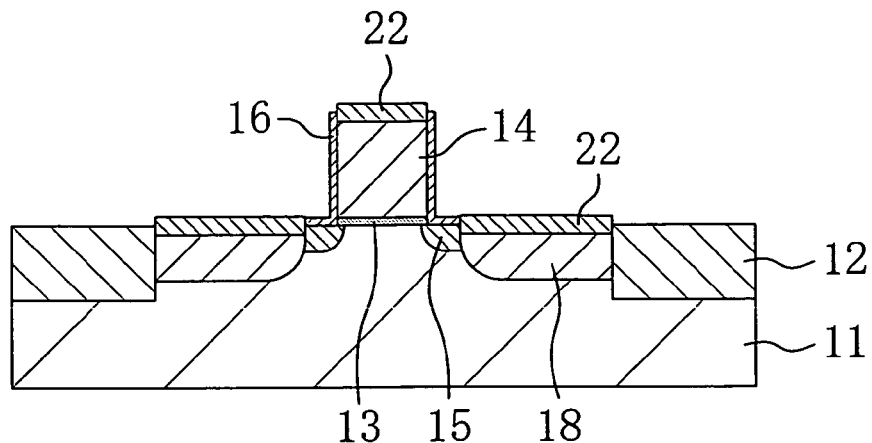
FIGS. 3A through 3C are cross-sectional views illustrating some of the process steps in the fabrication method for a semiconductor device according to the first embodiment of the present invention.

Next, in the process step illustrated in FIG. 3A, only the sidewalls 17 are selectively removed by etching using vapor-phase HF (hydrofluoric acid) or a diluted HF solution.

Figure 3B:
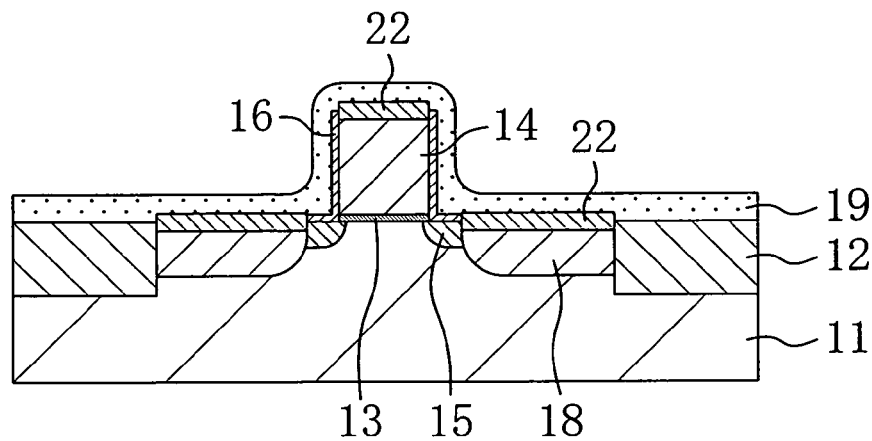

Next, in the process step illustrated in FIG. 3B, a 30- through 50-nm-thick stress liner film 19 of silicon nitride is formed by plasma chemical vapor deposition (P-CVD) to cover one of the silicide layers 22 located in the upper portion of the gate electrode 14, the entire surfaces of the L-shaped sidewalls 16 and the other ones of the silicide layers 22 located in the upper portions of the source/drain regions 18. In such P-CVD, the conditions under which a film is deposited or a process after the film deposition (for example, UV irradiation) allow the composition of the deposited film to vary. This permits formation of a stress film, i.e., either a deposited film having a tensile stress or a deposited film having a compressive stress. In this embodiment, a silicon nitride film generating a tensile stress is formed as the stress liner film 19. In this embodiment, the tensile stress means a stress causing that a channel region of the semiconductor substrate 11 located under the gate electrode 14 is pulled along the gate length direction.

Figure 3C:
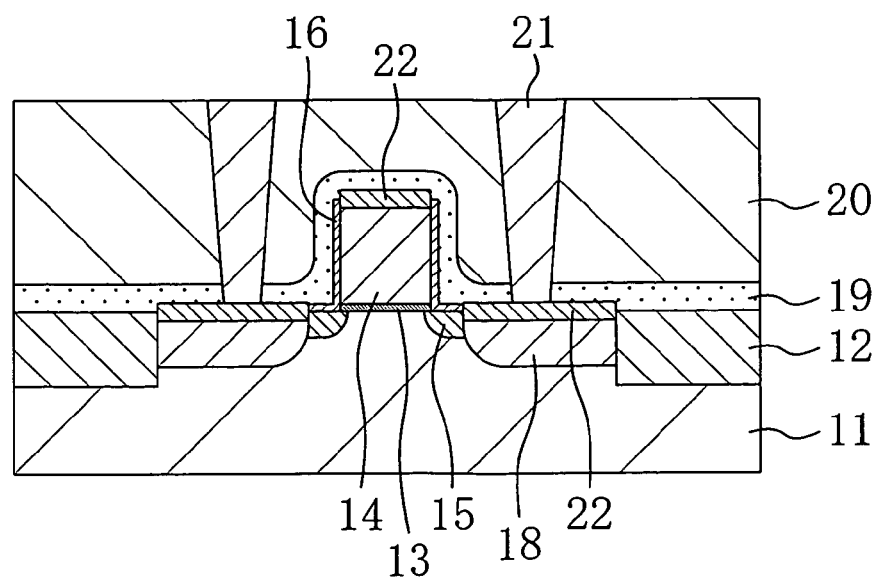

Next, in the process step illustrated in FIG. 3C, an interlayer dielectric 20 of silicon oxide is formed to cover the entire surface of the stress liner film 19, and contacts 21 of tungsten are formed to pass through the interlayer dielectric 20 and reach the ones of the silicide layers 22 located in the upper portions of the source/drain regions 18. In the above-mentioned process steps, the semiconductor device of this embodiment is formed.

Since in this embodiment the sidewalls 17 are removed in the process step illustrated in FIG. 3A, this allows the stress liner film 19 to become closer to the channel of a MIS transistor than that in a known art in which sidewalls corresponding to the sidewalls 17 are not removed. Therefore, the stress caused by the stress liner film 19 is more likely to travel to the MIS transistor than that in the known art. This permits formation of a MIS transistor having a higher driving force than a known MIS transistor. In this embodiment, a description was given of the case where the MIS transistor is an N-type MIS transistor and the stress liner film 19 has a tensile stress. However, also in a case where the MIS transistor is a P-type MIS transistor and the stress liner film 19 has a compressive film, the same effects can be obtained. In other words, the removal of the sidewalls 17 facilitates travel of the stress caused by the stress liner film 19 to the channel. This can enhance the driving force of the P-type MIS transistor. In this embodiment, the compressive stress means a stress causing that the channel region of the semiconductor substrate 11 located under the gate electrode 14 is compressed in the gate length direction.

In this embodiment, the gate electrode 14 and the source/drain regions 18 are arranged so that the surface orientation of the semiconductor substrate 11 along the gate length direction (the direction along which current flows from the source region to the drain region) becomes <100> surface. This can enhance the driving force of an N-type MIS transistor. In this embodiment, a description was given of the case where an N-type MIS transistor is used as the MIS transistor and a film having a tensile stress is used as the stress liner film 19. However, a P-type MIS transistor may be used as the MIS transistor, and a film having a compressive stress may be used as the stress liner film 19. In this case, the driving force of the P-type MIS transistor can be restrained from decreasing.

Figure 4:
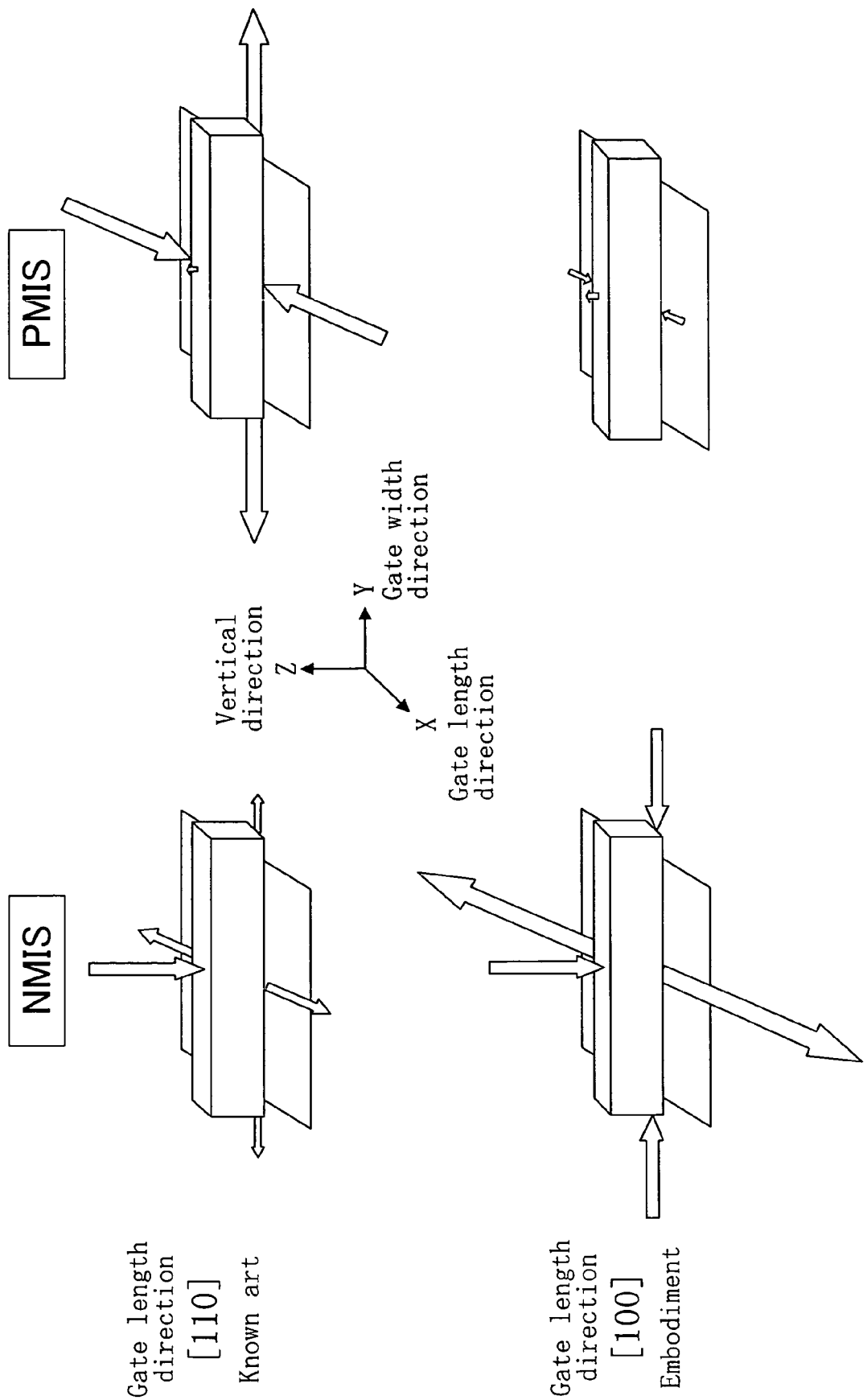
FIG. 4 is a diagram schematically illustrating directions of stresses that enhance the driving force of the semiconductor device.

The above-mentioned cases will be described with reference to FIG. 4. FIG. 4 is a diagram schematically illustrating the directions of stresses that enhance the driving forces of MIS transistors. In FIG. 4, the directions of stresses that enhance the driving forces are shown by the directions of arrows, and the degrees to which the driving forces are enhanced are shown by the sizes of the arrows. As illustrated in FIG. 4, for an N-type MIS transistor, both when the gate length direction is along the <110> orientation of the substrate and when it is along the <100> orientation thereof, the driving force is enhanced by the application of a tensile stress to the N-type MIS transistor along the gate length direction. When the gate length direction is along the <100> orientation of the substrate, the degree to which the driving force is enhanced is larger than that when it is along the <110> orientation thereof. In view of the above, it is found that when the gate length direction is along the <100> orientation as in this embodiment, the driving force of the N-type MIS transistor can be more significantly enhanced than that of the known MIS transistor.

On the other hand, for a P-type MIS transistor, when the gate length direction is along the <110> orientation of the substrate, the driving force of the P-type MIS transistor is enhanced by the application of a compressive stress to the P-type MIS transistor along the gate length direction. However, when the gate length direction is along the <100> orientation of the substrate, the driving force is hardly affected by the stress applied to the P-type MIS transistor along the gate length direction. It is found in view of the above that when the gate length direction is along the <100> orientation of the substrate as in this embodiment, even if the P-type MIS transistor is covered with the film having a tensile stress, the driving force can be restrained from decreasing as compared with the known art.

Embodiment 2

Figure 5:
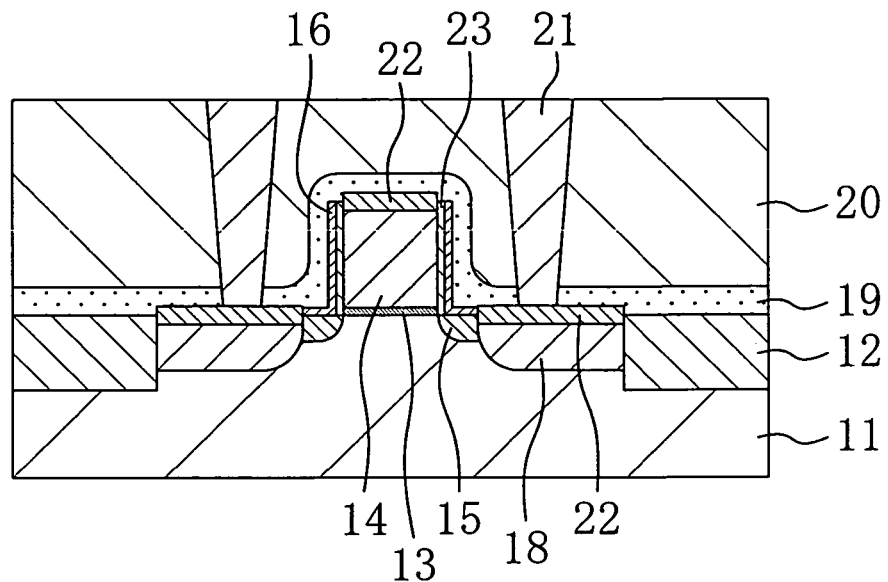
FIG. 5 is a cross-sectional view illustrating the structure of a semiconductor device according to a second embodiment of the present invention.

FIG. 5 is a cross-sectional view illustrating the structure of a semiconductor device according to a second embodiment of the present invention. In the semiconductor device of this embodiment, L-shaped sidewalls 16 are formed on both sides of a gate electrode 14 with sidewalls 23 interposed therebetween. The sidewalls 23 are made of silicon oxide and formed to have a thickness of 5 through 10 nm. The material and thickness of the sidewalls 23 are not limited to the above-mentioned material and thickness. The structure of the semiconductor device is the same as that in the first embodiment except for the above-mentioned structure thereof, and thus a description thereof is not given.

In this embodiment, the same effects as in the first embodiment can be obtained. Furthermore, formation of the sidewalls 23 allows lower corner parts of the gate electrode 14 to be protected. This can prevent the leakage current from being produced at the lower corner parts of the gate electrode 14.

Embodiment 3

Figure 6:
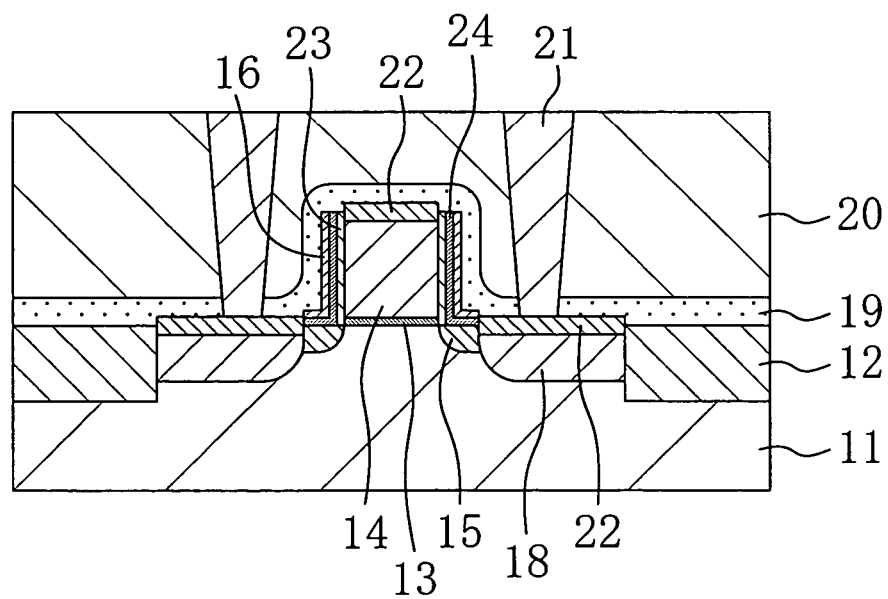
FIG. 6 is a cross-sectional view illustrating the structure of a semiconductor device according to a third embodiment of the present invention.

FIG. 6 is a cross-sectional view illustrating the structure of a semiconductor device according to a third embodiment of the present invention. In the semiconductor device of this embodiment, L-shaped sidewalls 16 are formed on both sides of a gate electrode 14 with sidewalls 23 interposed therebetween. Furthermore, additional sidewalls 24 are formed on the sidewalls 23. The sidewalls 23 are made of silicon oxide and formed to have a thickness of 5 through 10 nm. The material and thickness of the sidewalls 23 are not limited to the above-mentioned material and thickness. The structure of the semiconductor device is the same as that in the first embodiment except for the above-mentioned structure thereof, and thus a description thereof is not given.

In this embodiment, the same effects as in the first embodiment can be obtained. Furthermore, formation of the sidewalls 23 allows corner parts of the gate electrode 14 to be protected. This can prevent the leakage current from being produced at the corner parts of the gate electrode 14. Moreover, stacking of the sidewalls 23, 24 and 16 facilitates ensuring a high etching selectivity. This enhances flexibility in choice of etching conditions.

Embodiment 4

Figure 7:
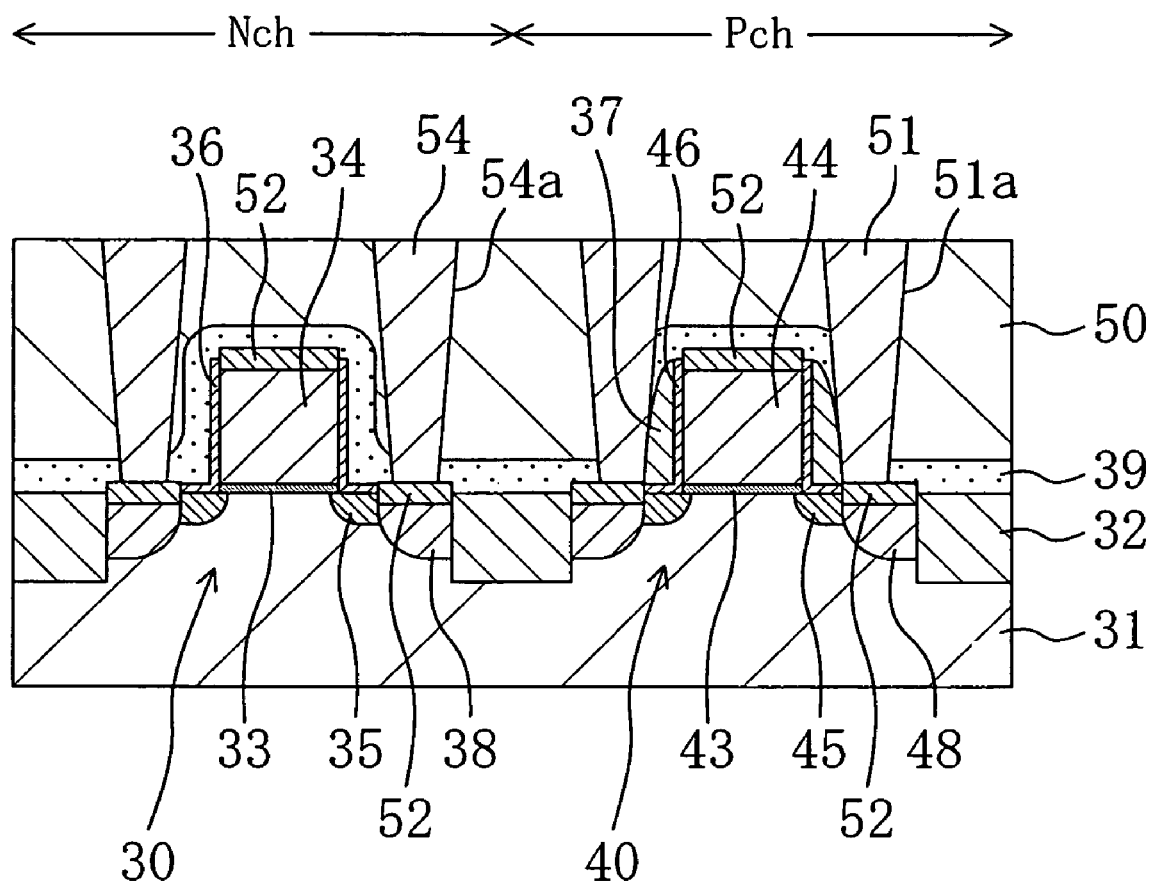
FIG. 7 is a cross-sectional view illustrating the structure of a semiconductor device according to a fourth embodiment of the present invention.

FIG. 7 is a cross-sectional view illustrating the structure of a semiconductor device according to a fourth embodiment of the present invention. In the semiconductor device of this embodiment, a semiconductor substrate 31 has an area Nch at which an N-channel transistor is formed (hereinafter, referred to as "N-channel transistor formation area Nch") and an area Pch at which a P-channel transistor is formed (hereinafter, referred to as "P-channel transistor formation area Pch"). An N-channel transistor and a P-channel transistor are formed at the N-channel transistor formation area Nch and the P-channel transistor formation area Pch, respectively. An active region 30 of the semiconductor substrate 31 in the N-channel transistor formation area Nch is electrically isolated from an active region 40 thereof in the P-channel transistor formation area Pch by an isolation region 32 thereof and well regions thereof having different conductivity types.

For the N-channel transistor formation area Nch, a gate insulating film 33 of silicon oxide is formed on the active region 30, and a gate electrode 34 of polysilicon is formed on the gate insulating film 33. SD extension diffusion regions 35 containing an N-type impurity at a concentration of $1 \times 10^{19}$ through $1 \times 10^{20}/cm^3$ are formed in regions of the active region 30 of the semiconductor substrate 31 extending from immediately below both lateral end parts of the gate electrode 34 and beyond both sides thereof.

5- through 10-nm-thick sidewalls 36 of silicon oxide forming an L shape in cross section are formed to cover both sides of the gate electrode 34 and portions of the semiconductor substrate 31 serving as the SD extension diffusion regions 35. Source/drain regions 38 containing an N-type impurity at a concentration of $1 \times 10^{20}/cm^3$ through $5 \times 10^{20}/cm^3$ are formed in regions of the semiconductor substrate 31 located further from the gate electrode 34 than the SD extension diffusion regions 35, i.e., regions of the semiconductor substrate 31 located outside an area covering the gate electrode 34 and the L-shaped sidewalls 36.

On the other hand, for the P-channel transistor formation area Pch, a gate insulating film 43 of silicon oxide is formed on the active region 40, and a gate electrode 44 of polysilicon is formed on the gate insulating film 43. SD extension diffusion regions 45 containing a P-type impurity at a concentration of $5 \times 10^{18}$ through $1 \times 10^{20}/cm^3$ are formed in regions of the active region 40 of the semiconductor substrate 31 extending from immediately below both lateral end parts of the gate electrode 44 and beyond both sides thereof.

5- through 10-nm-thick sidewalls 46 of silicon oxide forming an L shape in cross section are formed to cover both sides of the gate electrode 44 and portions of the semiconductor substrate 31 serving as the SD extension diffusion regions 45. Source/drain regions 48 containing a P-type impurity at a concentration of $1 \times 10^{20}/cm^3$ through $5 \times 10^{20}/cm^3$ are formed in regions of the semiconductor substrate 31 located further from the gate electrode 44 than the SD extension diffusion regions 45, i.e., regions of the semiconductor substrate 31 located outside an area covering the gate electrode 44 and the L-shaped sidewalls 46.

Silicide layers 52 are formed in the upper portions of the source/drain regions 38 and 48 of the semiconductor substrate 31 and the upper portions of the gate electrodes 34 and 44. A stress liner film 39 of silicon nitride is formed to cover the top surfaces of ones of the silicide layers 52 located in the upper portions of the gate electrodes 34 and 44, the entire surfaces of the L-shaped sidewalls 36 and 46 and the top surfaces of the other ones of the silicide layers 52 located in the upper portions of the source/drain regions 38 and 48 of the semiconductor substrate 31. In this embodiment, a film generating a tensile stress is formed as the stress liner film 39. In this embodiment, the tensile stress means a stress causing that a channel region of the semiconductor substrate 31 located under each of the gate electrodes 34 and 44 is pulled along the gate length direction.

The entire surface of the stress liner film 39 is covered with an interlayer dielectric 50 of silicon oxide. Contacts 51 are formed to pass through the interlayer dielectric 50 and reach the top surfaces of ones of the silicide layers 52 located in the upper portions of the source/drain regions 48. Other contacts 54 are formed to pass through the interlayer dielectric 50 and reach the top surfaces of other ones of the silicide layers 52 located in the upper portions of the source/drain regions 38.

In the semiconductor device of this embodiment, the gate electrodes 34 and 44 and the source/drain regions 38 and 48 are arranged so that the surface orientation of the semiconductor substrate 31 along the channel direction (the direction along which current flows from each source region to each drain region) becomes <100> surface.

FIGS. 8A through 9C and 10 are cross-sectional views illustrating process steps in a fabrication method for a semiconductor device according to the fourth embodiment of the present invention. In the semiconductor device fabrication method of this embodiment, first, in the process step illustrated in FIG. 8A, gate insulating films 33 and 43 are formed on a semiconductor substrate 31 of silicon, and gate electrodes 34 and 44 are formed on the gate insulating films 33 and 43, respectively. The gate electrodes 34 and 44 are arranged so that their gate length directions are along the <100> orientation of silicon forming the semiconductor substrate 31. In this case, after a wafer is turned 45 degrees from its known orientation that allows the gate length direction to be along the <110> orientation of silicon, the gate electrodes 34 and 44 may be patterned. Thereafter, 5- through 10-nm-thick insulating films 36a and 46a of silicon oxide are formed to cover the semiconductor substrate 31 and the gate electrodes 34 and 44.

Figure 8A:
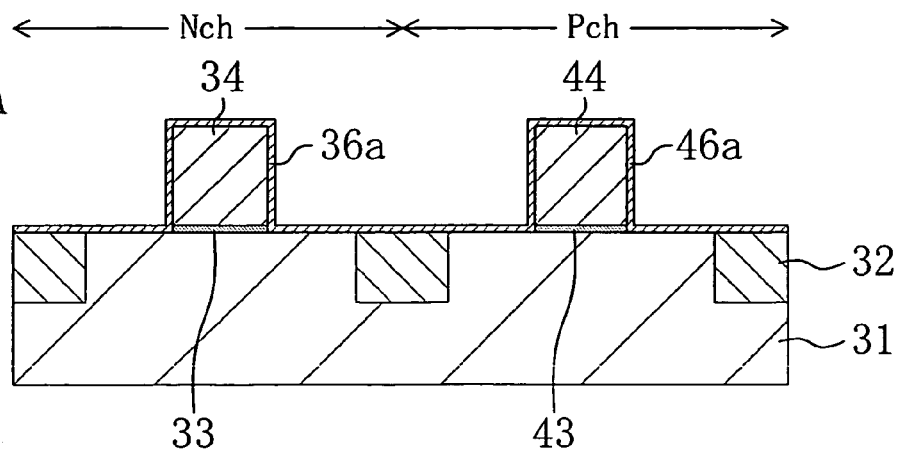
FIGS. 8A through 8D are cross-sectional views illustrating some of process steps in a fabrication method for a semiconductor device according to the fourth embodiment of the present invention.
Figure 8B:
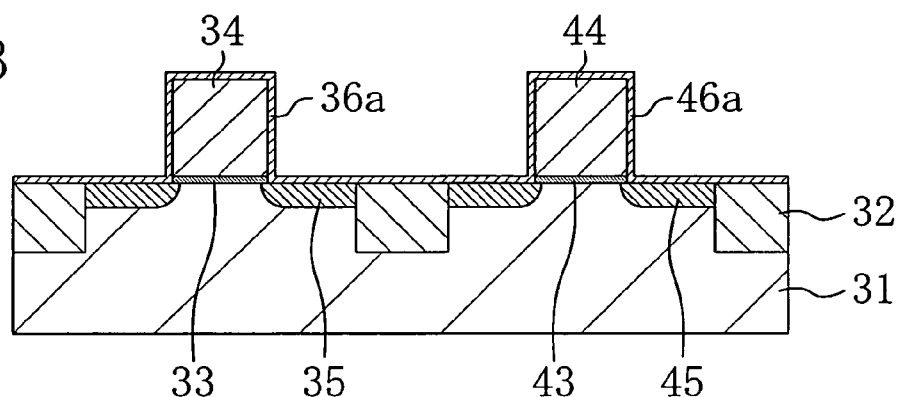

Next, in the process step illustrated in FIG. 8B, N-type impurity ions are implanted into the N-channel transistor formation area Nch using the gate electrode 34 as a mask, thereby forming SD extension diffusion regions 35. Next, P-type impurity ions are implanted into the P-channel transistor formation area Pch using the gate electrode 44 as a mask, thereby forming other SD extension diffusion regions 45. While ions are implanted into one of the transistor formation areas, the other thereof is covered with a mask (this state is not shown). Thereafter, the substrate area is subjected to heat treatment for activating the impurities.

Figure 8C:
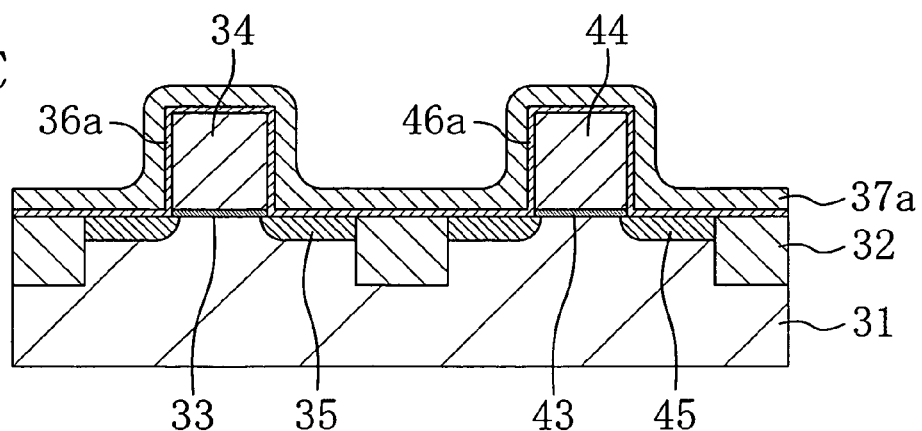

Next, in the process step illustrated in FIG. 8C, 30- through 50-nm-thick insulating film 37a of silicon nitride is deposited on the insulating films 36a and 46a.

Figure 8D:
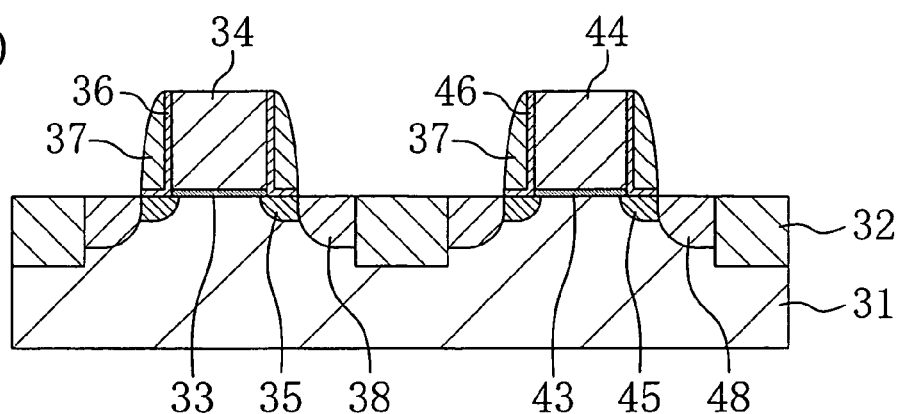

Next, in the process step illustrated in FIG. 8D, the insulating films 36a, 46a and 37a are subjected to anisotropic etching, thereby removing the insulating films 36a, 46a and 37a except for parts thereof located on the side surfaces of the gate electrode 44. In this way, L-shaped sidewalls 36 and 46 forming an L shape in cross section are formed on both sides of the gate electrodes 34 and 44, and sidewalls 37 are formed on the L-shaped sidewalls 36 and 46. Thereafter, N-type impurity ions are implanted into the N-channel transistor area Nch using the gate electrode 34, the L-shaped sidewalls 36 and the sidewalls 37 as masks, thereby forming source/drain regions 38 in the semiconductor substrate 31. Furthermore, P-type impurity ions are implanted into the P-channel transistor formation area Pch using the gate electrode 44, the L-shaped sidewalls 46 and the sidewalls 37 as masks, thereby forming source/drain regions 48 in the semiconductor substrate 31. While ions are implanted into one of the transistor formation areas, the other thereof is covered with a mask (this state is not shown). Thereafter, the substrate area is subjected to heat treatment for activating the impurities.

Figure 9A:
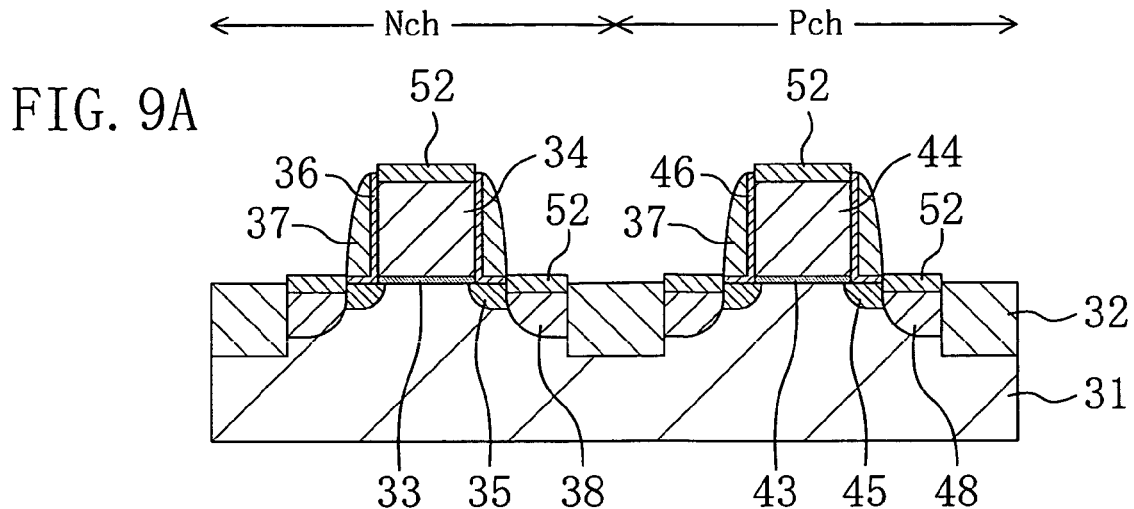
FIGS. 9A through 9C are cross-sectional views illustrating some of the process steps in the fabrication method for a semiconductor device according to the fourth embodiment of the present invention.

Next, in the process step illustrated in FIG. 9A, silicide layers 52 are formed by siliciding the top surfaces of the gate electrodes 34 and 44 and source/drain regions 38 and 48.

Figure 9B:
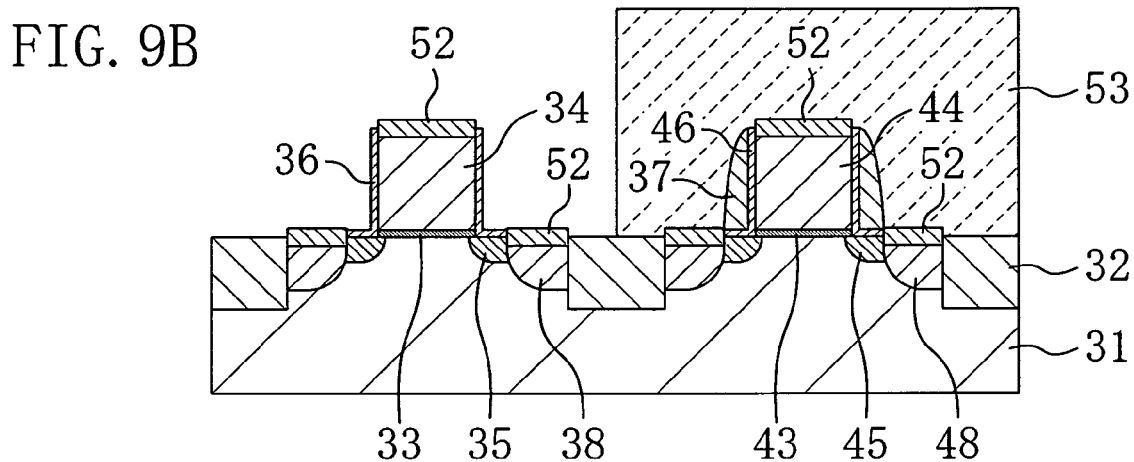

Next, in the process step illustrated in FIG. 9B, a mask 53 is formed to cover the P-channel transistor formation area Pch, and only ones of the sidewalls 37 located on the N-channel transistor formation area Nch are selectively removed by etching using vapor-phase HF (hydrofluoric acid) or a diluted HF solution. Since in this case the mask 53 is formed to cover the P-channel transistor formation area Pch, the other ones of the sidewalls 37 located on the P-channel transistor formation area Pch remain.

Figure 9C:
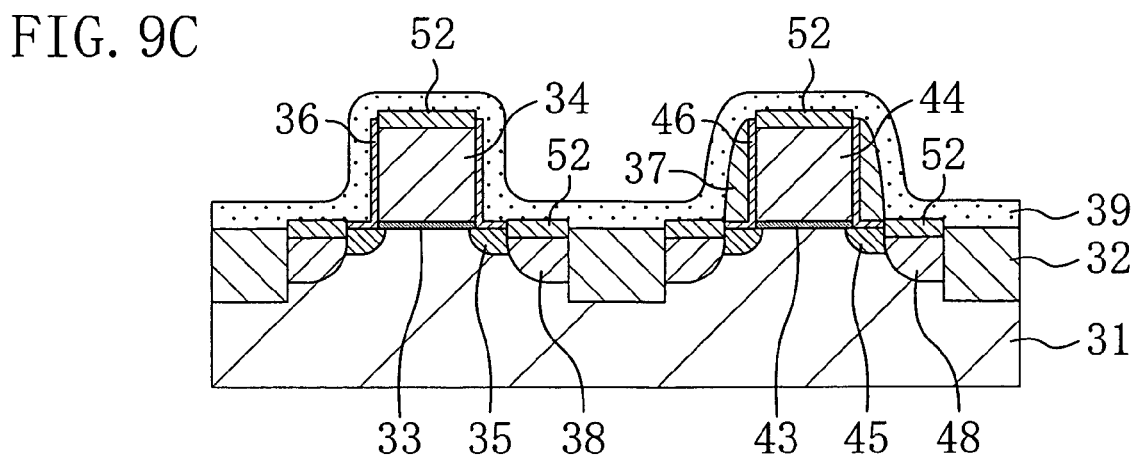

Next, in the process step illustrated in FIG. 9C, the mask 53 is removed, and then a 30- through 50-nm-thick stress liner film 39 of silicon nitride is formed to cover ones of the silicide layers 52 located in the upper portions of the gate electrodes 34 and 44, the L-shaped sidewalls 36 and 46, and the source/drain regions 38 and 48.

Figure 10:
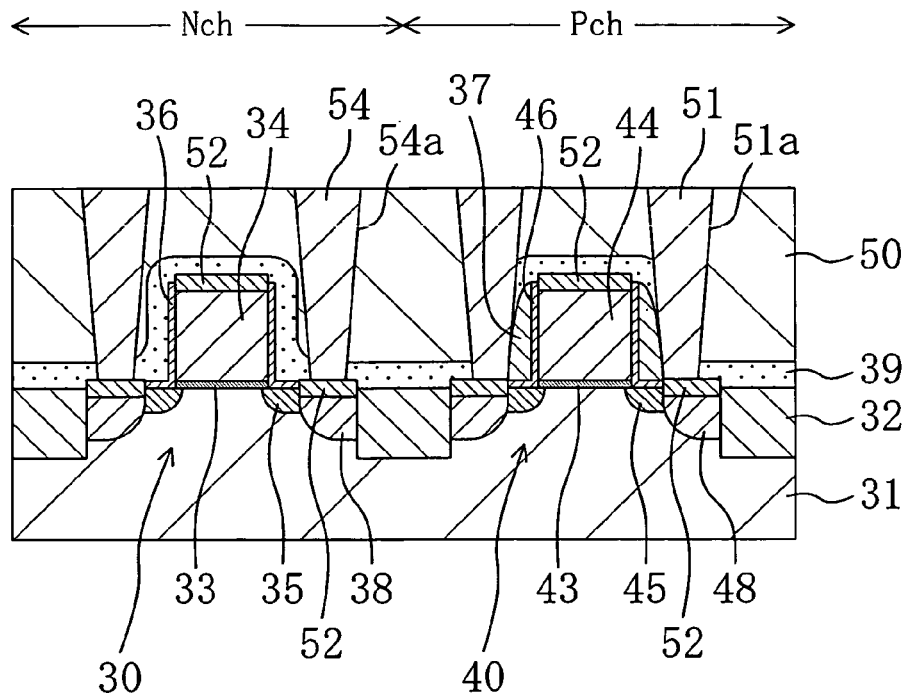
FIG. 10 is a cross-sectional view illustrating one of the process steps in the fabrication method for a semiconductor device according to the fourth embodiment of the present invention.

Next, in the process step illustrated in FIG. 10, an interlayer dielectric 50 is formed to cover the entire surface of the stress liner film 39, and contact holes 51a and 54a are formed to pass through the interlayer dielectric 50 and reach ones of the silicide layers 52 located in the upper portions of the source/drain regions 38 and 48. In the N-channel transistor formation area Nch, the contact holes 54a are formed in regions of the interlayer dielectric 50 that does not come into contact with parts of the stress liner film 39 located on the L-shaped sidewalls 36. On the other hand, in the P-channel transistor formation area Pch, parts of the stress liner film 39 located on the outer side surfaces of the sidewalls 37 are removed.

In the process step of this embodiment illustrated in FIG. 9B, only ones of sidewalls 37 located on an N-channel transistor formation area Nch are selectively removed, and the other ones of the sidewalls 37 located on a P-channel transistor formation area Pch remain. Therefore, the stress caused by a stress liner film 39 is more likely to travel to a channel region of the N-channel transistor formation area Nch and less likely to travel to a channel region of the P-channel transistor formation area Pch.

In the process step of this embodiment illustrated in FIG. 10, parts of the stress liner film 39 located on the P-channel transistor formation area Pch is partially removed in the formation of contact holes 51. This can restrain the stress caused by the stress liner film 39 from traveling to a channel of a P-channel transistor.

In view of the above, even when in this embodiment an N-channel transistor and the P-channel transistor are covered with a stress liner film of one type having a tensile stress, the driving force of the P-channel transistor can be prevented from decreasing.

In this embodiment, the gate electrodes 34 and 44 and the source/drain regions 38 and 48 are arranged so that the surface orientation of the semiconductor substrate 31 along the gate length direction (the direction along which current flows from each source region to each drain region) becomes <100> surface. This can enhance the driving force of an N-type MIS transistor. The driving force of the P-type MIS transistor can be restrained from decreasing.

In the process step of this embodiment illustrated in FIG. 9B, only ones of the sidewalls 37 located on the N-channel transistor formation area Nch are selectively removed. In the process step of this embodiment illustrated in FIG. 10, parts of the stress liner film 39 located on the side surfaces of ones of the sidewalls 37 located on the P-channel transistor formation area Pch are removed. In this embodiment, both of the process steps illustrated in FIGS. 9A and 10 need not always be carried out. Either of the process steps need only be carried out. In the process step of this embodiment illustrated in FIG. 10, the contact holes 51a are brought into contact with the associated sidewalls 37 in their formation. However, in this embodiment, the contact holes 51a need not always be brought into contact with the associated sidewalls 37. The formation of the contact holes 51a leads to partial removal of the stress liner film 39. Therefore, when parts of the stress liner film 39 located between the contact holes 51a and the sidewalls 37 are reduced in thickness, this can also provide the effect of reducing the stress.

Embodiment 5

Figure 11:
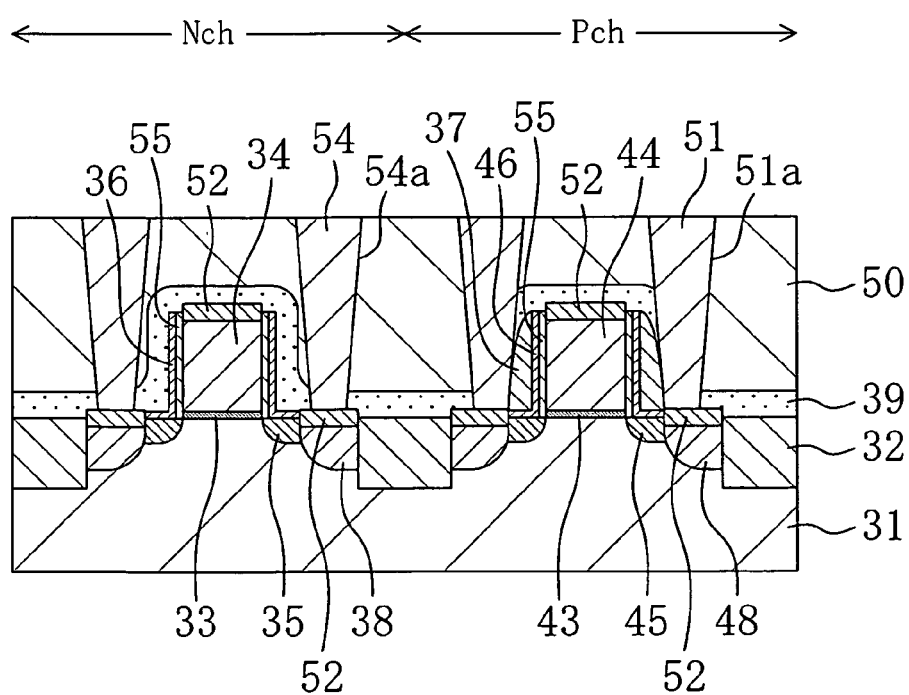
FIG. 11 is a cross-sectional view illustrating the structure of a semiconductor device according to a fifth embodiment of the present invention.

FIG. 11 is a ctoss-sectional view illustrating the structure of a semiconductor device according to a fifth embodiment of the present invention. In the semiconductor device of this embodiment, L-shaped sidewalls 36 and 46 are formed on both sides of gate electrodes 34 and 44 with sidewalls 55 interposed between the L-shaped sidewalls 55 and the gate electrodes 34 and 44. The sidewalls 55 are made of silicon oxide and formed to have a thickness of 5 through 10 nm. The material and thickness of the sidewalls 55 are not limited to the above-mentioned material and thickness. The structure of the semiconductor device is the same as that in the fourth embodiment except for the above-mentioned structure thereof, and thus a description thereof is not given.

In this embodiment, the same effects as in the fourth embodiment can be obtained. Furthermore, formation of the sidewalls 55 allows comer parts of the gate electrodes 34 and 44 to be protected. This can prevent the leakage current from being produced at the corner parts of the gate electrodes 34 and 44.

Embodiment 6

Figure 12:
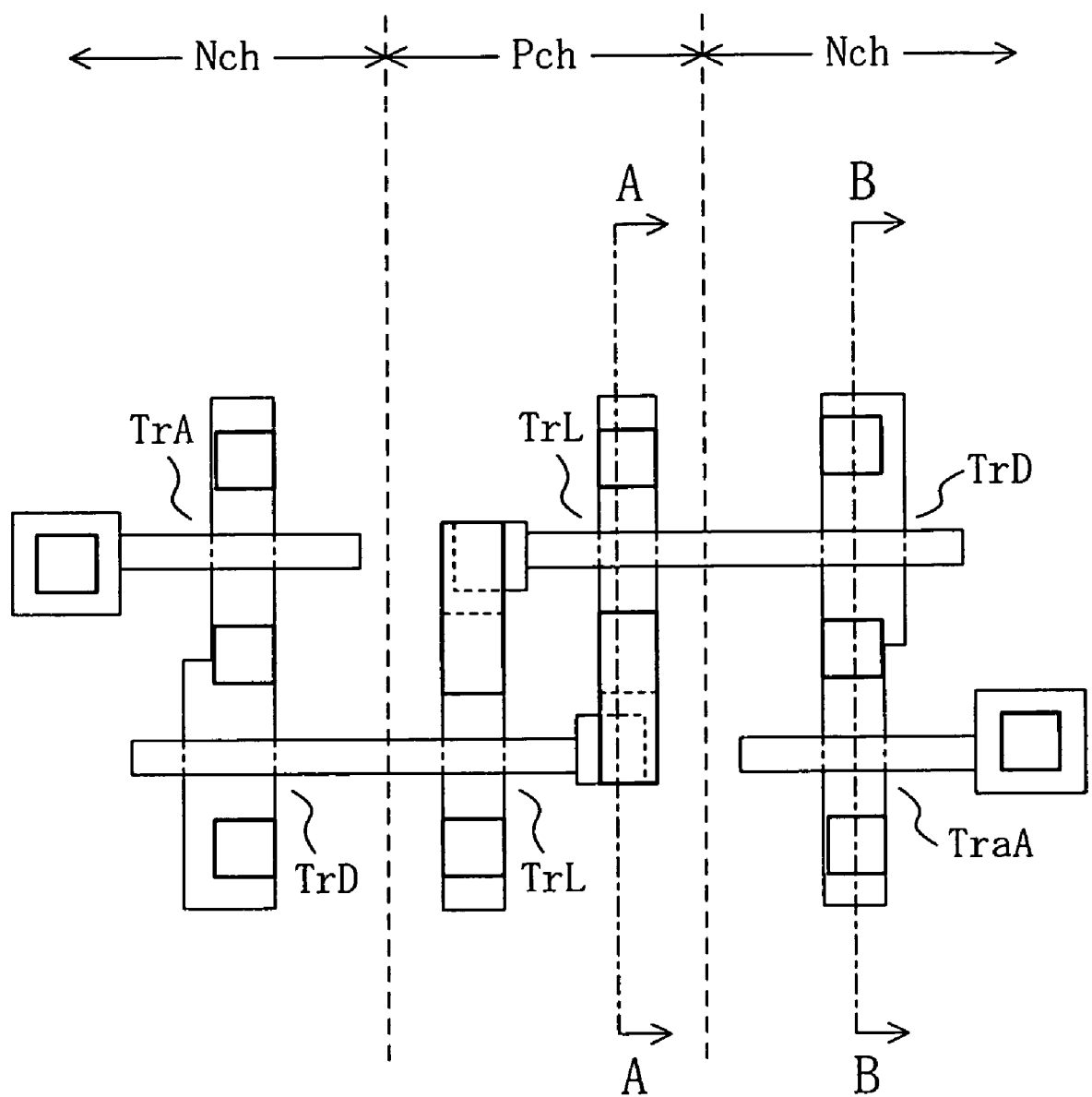
FIG. 12 is a plan view illustrating a 1-bit SRAM cell according to a sixth embodiment of the present invention.

FIG. 12 is a plan view illustrating a 1-bit static random access memory (SRAM) cell according to a sixth embodiment of the present invention. In the SRAM of this embodiment, N-channel transistor formation areas Nch are located at both sides of a P-channel transistor formation area Pch located in the middle section of the cell. An access transistor TrA and a drive transistor TrD are located in each N-channel transistor formation area Nch, and load transistors TrL are located in the P-channel transistor formation area Pch.

Figure 13A:
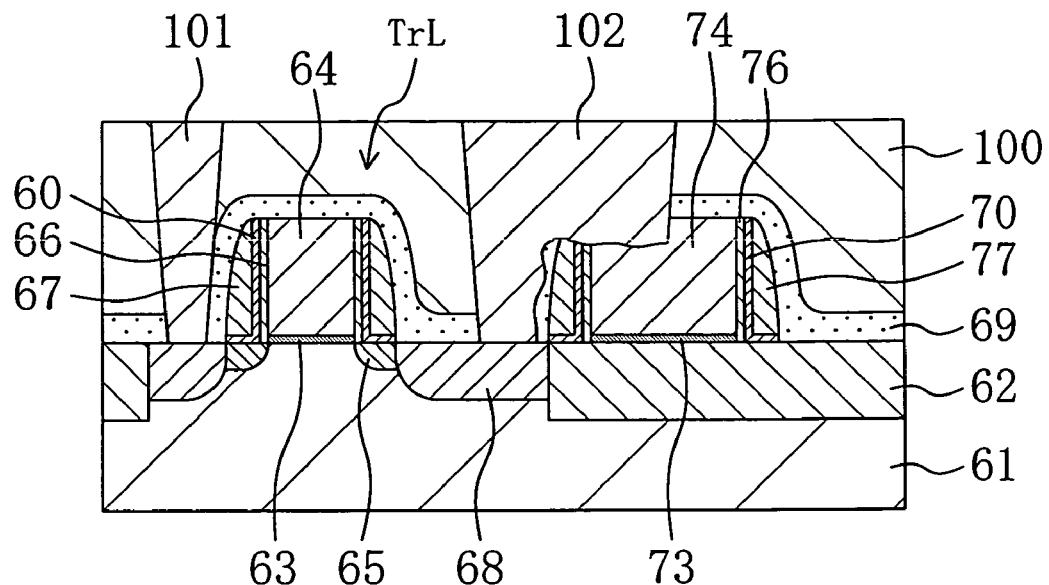
FIGS. 13A and 13B are diagrams illustrating cross sections taken along the lines A-A and B-B in FIG. 12, respectively.
Figure 13B:
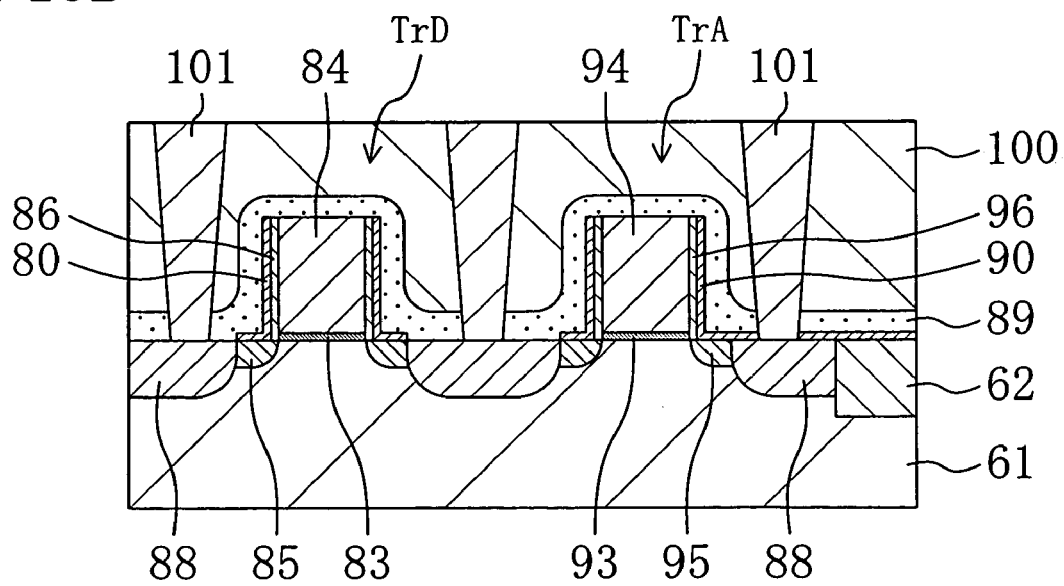
Figure 14A:
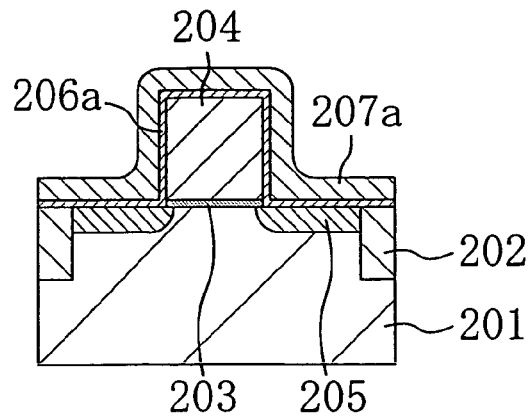
FIGS. 14A through 14D are cross-sectional views illustrating process steps in a fabrication method for a semiconductor device according to a known art.
Figure 14B:
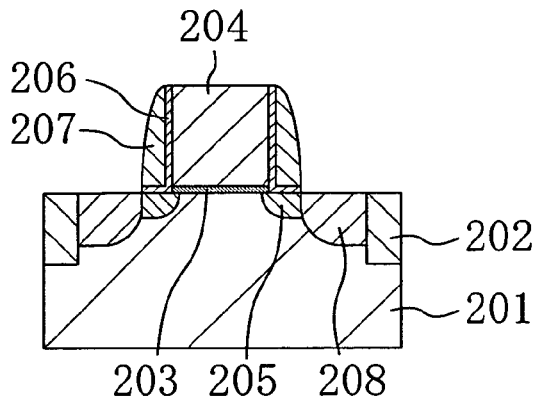
Figure 14C:
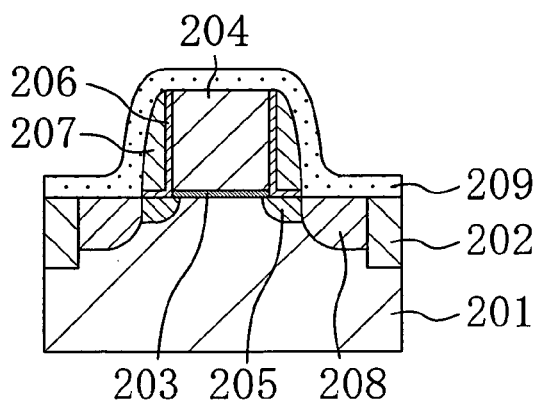
Figure 14D:
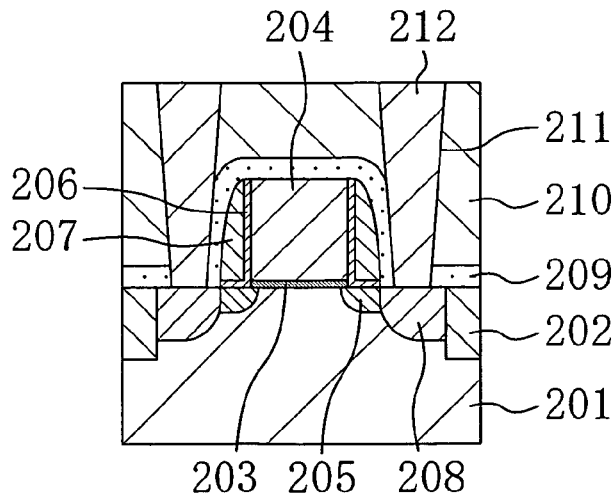

FIGS. 13A and 13B are diagrams illustrating cross sections taken along the lines A-A and B-B in FIG. 12, respectively. As illustrated in FIG. 13A, when the SRAM of this embodiment is viewed in the cross section taken along the line A-A, a gate insulating film 63 and a gate electrode 64 of the load transistor TrL are located on a semiconductor substrate 61. Sidewalls 66 forming a plate-like shape in cross section, sidewalls 60 forming an L shape in cross section, and sidewalls 67 covering the entire surfaces of the sidewalls 60 are sequentially stacked on both sides of the gate electrode 64. SD extension diffusion regions 65 are formed in regions of the semiconductor substrate 61 extending from immediately below both lateral end parts of the gate electrode 64 and beyond both sides thereof. Source/drain regions 68 are formed further from the gate electrode 64 than the SD extension diffusion regions 65. The top surface of the gate electrode 64 and the sidewalls 67 are covered with a stress liner film 69.

As illustrated in FIG. 13A, when viewed in the cross section taken along the line A-A, a gate interconnect 74 is formed on a region of an isolation region 62 adjacent to the load transistor TrL. This gate interconnect 74 represents a part of a gate electrode of the drive transistor TrD (illustrated in FIG. 12) extending across the top surface of the isolation region 62. Sidewalls 76 forming a plate-like shape in cross section, sidewalls 70 forming an L shape in cross section, and sidewalls 77 covering the entire surfaces of the sidewalls 70 are sequentially stacked on both sides of the gate interconnect 74. The gate interconnect 74 and the sidewalls 77 are covered with the stress liner film 69.

The entire surface of the stress liner film 69 is covered with an interlayer dielectric 100. A contact 101 comes into contact with one of the source/drain regions 68 of the load transistor TrL that is located further from the gate interconnect 74 than the other thereof. A shared contact 102 comes into contact with part of the other of the source/drain regions 68 of the load transistor TrL that is close to the gate interconnect 74 and part of the gate interconnect 74.

On the other hand, as illustrated in FIG. 13B, the drive transistor TrD and the access transistor TrA are seen in the cross section of the SRAM of this embodiment taken along the line B-B. For the drive transistor TrD, a gate insulating film 83 and a gate electrode 84 are formed on a semiconductor substrate 61, and sidewalls 86 forming a plate-like shape in cross section and sidewalls 80 forming an L shape in cross section are formed on both sides of the gate electrode 84. SD extension diffusion regions 85 are formed in regions of the semiconductor substrate 61 extending from both lateral end parts of the gate electrode 84 and beyond both sides thereof. Two of source/drain regions 88 are formed in regions of the semiconductor substrate 61 located adjacent to the SD extension diffusion regions 85 and further from the gate electrode 84 than the SD extension diffusion regions 85.

For the access transistor TrA, a gate insulating film 93 and a gate electrode 94 are formed on the semiconductor substrate 61, and sidewalls 96 forming a plate-like shape in cross section and sidewalls 90 forming an L shape in cross section are formed on both sides of the gate electrode 94. SD extension diffusion regions 95 are formed in regions of the semiconductor substrate 61 extending from immediately below both lateral end parts of the gate electrode 94 and beyond both sides thereof. Two of source/drain regions 88 are formed in regions of the semiconductor substrate 61 located adjacent to the SD extension diffusion regions 95 and further from the gate electrode 94 than the SD extension diffusion regions 95.

A stress liner film 89 is formed to cover the gate electrodes 84 and 94, the L-shaped sidewalls 80 and 90, and the source/drain regions 88 and 98 and covered with an interlayer dielectric 100. Contacts 101 are formed to pass through the interlayer dielectric 100 and reach the source/drain regions 88 and 98.

Typically, in order to operate SRAMs, significance is attached to the balance among a load transistor, an access transistor and a drive transistor. In this embodiment, when the transistors are covered with a film of one type, this can also restrain the driving force of each transistor from decreasing. Therefore, a smooth operation of SRAMs can be achieved.

Other Embodiments

In the above-mentioned embodiments, contacts are formed to both sides of a gate electrode. However, contacts need not always exist to both sides of a gate electrode. Furthermore, a contact may come into contact with a stress liner film.

In the above-mentioned embodiments, a silicide layer made of a reaction product of a refractory metal and silicon is formed on a gate electrode of polysilicon. However, the whole of a gate electrode may be silicided. Alternatively, a gate electrode may be formed of a metal.

What is claimed is:

1. A semiconductor device having a MIS transistor, said MIS transistor comprising:
    a first gate insulating film formed on a semiconductor substrate;
    a first gate electrode formed on the first gate insulating film;
    a first sidewall covering the sides of the first gate electrode and the top surface of part of the semiconductor substrate and made of a first insulating film forming an L shape in cross section;
    first source/drain regions formed in regions of the semiconductor substrate located outside an area covered by the first gate electrode and the first sidewall;
    a stress-applying insulating film covering the first gate electrode and the first sidewall; and
    a second sidewall forming a plate-like shape in cross section and made of a second insulating film, the second sidewall being formed between the first gate electrode and the first sidewall, wherein
    the stress-applying insulating film is in contact with the bend of the L-shaped first sidewall, and
    a third sidewall forming an L shape in cross section and made of a third insulating film is formed between the first sidewall and the second sidewall and between the semiconductor substrate and the first sidewall.

2. The semiconductor device of claim 1, wherein
    the semiconductor substrate is made of silicon, and
    a gate length direction of the first gate electrode is along a <100> orientation of the silicon.

3. The semiconductor device of claim 1, wherein
    silicide layers are formed in an upper portion of the first gate electrode and respective upper portions of the first source/drain regions.

4. The semiconductor device of claim 1, wherein
    SD extension diffusion regions are formed in regions of the semiconductor substrate located under the first sidewall.

5. The semiconductor device of claim 1, wherein
    the MIS transistor is an N-type MIS transistor, and
    the stress-applying insulating film has a tensile stress.

6. The semiconductor device of claim 5 further comprising a P-type MIS transistor,
    wherein the P-type MIS transistor comprises:
    a second gate insulating film formed on the semiconductor substrate;
    a second gate electrode formed on the second gate insulating film;
    a fourth sidewall formed on the sides of the second gate electrode, forming an L shape in cross section, and made of the first insulating film;
    a fifth sidewall formed on the fourth sidewall and made of a fourth insulating film; and
    second source/drain regions formed in regions of the semiconductor substrate located outside an area covered by the second gate electrode and the third sidewall.

7. The semiconductor device of claim 6 further comprising:
    an interlayer dielectric covering the N-type MIS transistor and the P-type MIS transistor; and
    a contact passing through the interlayer dielectric and reaching the second source/drain regions of the P-type MIS transistor, wherein the contact comes into contact with the fifth sidewall.

8. The semiconductor device of claim 6, wherein the N-type MIS transistor and the P-type MIS transistor form an SRAM.

9. The semiconductor device of claim 1, wherein the MIS transistor is a P-type MIS transistor, and the stress-applying insulating film has a compressive stress.

10. The semiconductor device of claim 1, wherein the first gate insulating film and the first gate electrode are formed on an active region surrounded by an isolation region of the semiconductor substrate.

11. The semiconductor device of claim 1, wherein the first sidewall is made of silicon oxide.

12. The semiconductor device of claim 1, wherein the first sidewall has a width of 40 nm through 60 nm at a bottom thereof.

13. The semiconductor device of claim 1, wherein the second sidewall is made of silicon oxide.

14. The semiconductor device of claim 1, wherein the second sidewall has a thickness of 5 nm through 10 nm.

15. The semiconductor device of claim 1, wherein the stress-applying insulating film is made of silicon nitride.

16. The semiconductor device of claim 1, wherein the stress-applying insulating film has a thickness of 30 nm through 50 nm.

17. The semiconductor device of claim 1, wherein the stress-applying insulating film has a tensile stress along a gate length direction of a channel region of the semiconductor substrate located under the first gate electrode.

18. The semiconductor device of claim 1, wherein the first gate insulating film is made of silicon oxide.

19. The semiconductor device of claim 1, wherein the first gate electrode includes a polysilicon film.

20. The semiconductor device of claim 1, wherein the first gate electrode contains metal.

21. The semiconductor device of claim 1, wherein the first source/drain regions contain an N-type impurity at a concentration of $1\times10^{20}/cm^3$ or more.

22. The semiconductor device of claim 4, wherein the SD extension diffusion regions contain an N-type impurity at a concentration of $1\times10^{19}/cm^3$ through $1\times10^{20}/cm^3$.

23. The semiconductor device of claim 1 further comprising:
a first silicide layer formed on the first gate electrode; and
second silicide layers formed on the first source/drain regions,
wherein the stress-applying insulating film is formed to cover the top surface of the first silicide layer, the entire surface of the first sidewall and the top surface of the second silicide layers.

24. The semiconductor device of claim 23 further comprising:
an interlayer dielectric formed on the stress-applying insulating film; and
a contact passing through the interlayer dielectric and the stress-applying insulating film, and reaching the second silicide layers.

25. A semiconductor device having an N-type MIS transistor and a P-type MIS transistor, said N-type MIS transistor comprising:
a first gate insulating film formed on a semiconductor substrate;
a first gate electrode formed on the first gate insulating film;
a first sidewall covering the sides of the first gate electrode and the top surface of part of the semiconductor substrate and made of a first insulating film forming an L shape in cross section;
first source/drain regions formed in regions of the semiconductor substrate located outside an area covered by the first gate electrode and the first sidewall; and
a stress-applying insulating film covering the first gate electrode and the first sidewalls, and
said P-type MIS transistor comprising:
a second gate insulating film formed on the semiconductor substrate;
a second gate electrode formed on the second gate insulating film;
a second sidewall formed on the sides of the second gate electrode, forming an L shape in cross section, and made of the first insulating film;
a third sidewall formed on the second sidewall and made of a second insulating film; and
second source/drain regions formed in regions of the semiconductor substrate located outside an area covered by the second gate electrode and the second sidewall, wherein
the stress-applying insulating film has a tensile stress, and
a fourth sidewall forming a plate-like shape in cross section and made of a third insulating film is formed between the first gate electrode and the first sidewall.

26. The semiconductor device of claim 25 further comprising:
an interlayer dielectric covering the N-type MIS transistor and the P-type MIS transistor; and
a contact passing through the interlayer dielectric and reaching the second source/drain regions of the P-type MIS transistor,
wherein the contact comes into contact with the third sidewall.

27. The semiconductor device of claim 25, wherein the N-type MIS transistor and the P-type MIS transistor form an SRAM.

28. A semiconductor device having a MIS transistor, said MIS transistor comprising:
a first gate insulating film formed on a semiconductor substrate;
a first gate electrode formed on the first gate insulating film;
a first sidewall covering the sides of the first gate electrode and the top surface of part of the semiconductor substrate and made of a first insulating film forming an L shape in cross section;
first source/drain regions formed in regions of the semiconductor substrate located outside an area covered by the first gate electrode and the first sidewall; and
a stress-applying insulating film covering the first gate electrode and the first sidewalls, wherein
a second sidewall forming a plate-like shape in cross section and made of a second insulating film is formed between the first gate electrode and the first sidewall,
the MIS transistor is an N-type MIS transistor,
the stress-applying insulating film has a tensile stress, and
a third sidewall forming an L shape in cross section and made of a third insulating film is formed between the first sidewall and the second sidewall and between the semiconductor substrate and the first sidewall.

29. The semiconductor device of claim 28, wherein the semiconductor substrate is made of silicon, and a gate length direction of the first gate electrode is along a <100> orientation of the silicon.

30. The semiconductor device of claim 28, wherein silicide layers are formed in an upper portion of the first gate electrode and respective upper portions of the first source/drain regions.

31. The semiconductor device of claim 28, wherein SD extension diffusion regions are formed in regions of the semiconductor substrate located under the first sidewall.

32. The semiconductor device of claim 28, wherein the first gate insulating film and the first gate electrode are formed on an active region surrounded by an isolation region of the semiconductor substrate.

33. The semiconductor device of claim 28, wherein the first sidewall is made of silicon oxide.

34. The semiconductor device of claim 28, wherein the first sidewall has a width of 40 nm through 60 nm at a bottom thereof.

35. The semiconductor device of claim 28, wherein the second sidewall is made of silicon oxide.

36. The semiconductor device of claim 28, wherein the second sidewall has a thickness of 5 nm through 10 nm.

37. The semiconductor device of claim 28, wherein the stress-applying insulating film is made of silicon nitride.

38. The semiconductor device of claim 28, wherein the stress-applying insulating film has a thickness of 30 nm through 50 nm.

39. The semiconductor device of claim 28, wherein the stress-applying insulating film has a tensile stress along a gate length direction of a channel region of the semiconductor substrate located under the first gate electrode.

40. The semiconductor device of claim 28, wherein the first gate insulating film is made of silicon oxide.

41. The semiconductor device of claim 28, wherein the first gate electrode includes a polysilicon film.

42. The semiconductor device of claim 28, wherein the first gate electrode contains metal.

43. The semiconductor device of claim 28, wherein the first source/drain regions contain an N-type impurity at a concentration of $1 \times 10^{20}/cm^3$ or more.

44. The semiconductor device of claim 31, wherein the SD extension diffusion regions contain an N-type impurity at a concentration of $1 \times 10^{19}/cm^3$ through $1 \times 10^{20}/cm^3$.

45. The semiconductor device of claim 28 further comprising:
a first silicide layer formed on the first gate electrode; and
second silicide layers formed on the first source/drain regions,
wherein the stress-applying insulating film is formed to cover the top surface of the first silicide layer, the entire surface of the first sidewall and the top surface of the second silicide layers.

46. The semiconductor device of claim 45 further comprising:
an interlayer dielectric formed on the stress-applying insulating film; and
a contact passing through the interlayer dielectric and the stress-applying insulating film, and reaching the second silicide layers.

47. A semiconductor device having a MIS transistor, said MIS transistor comprising:
a first gate insulating film formed on a semiconductor substrate;
a first gate electrode formed on the first gate insulating film;
a first sidewall covering the sides of the first gate electrode and the top surface of part of the semiconductor substrate and made of a first insulating film forming an L shape in cross section;
first source/drain regions formed in regions of the semiconductor substrate located outside an area covered by the first gate electrode and the first sidewall; and
a stress-applying insulating film covering the first gate electrode and the first sidewalls, wherein
a second sidewall forming a plate-like shape in cross section and made of a second insulating film is formed between the first gate electrode and the first sidewall,
the MIS transistor is a P-type MIS transistor,
the stress-applying insulating film has a compressive stress, and
a third sidewall forming an L shape in cross section and made of a third insulating film is formed between the first sidewall and the second sidewall and between the semiconductor substrate and the first sidewall.

* * * * *